United States Patent
Levinski et al.

(10) Patent No.: US 12,170,215 B2
(45) Date of Patent: Dec. 17, 2024

(54) SYSTEMS AND METHODS FOR CORRECTION OF IMPACT OF WAFER TILT ON MISREGISTRATION MEASUREMENTS

(71) Applicant: KLA Corporation, Milpitas, CA (US)

(72) Inventors: Vladimir Levinski, Migdal HaEmek (IL); Daria Negri, Nesher (IL); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 1141 days.

(21) Appl. No.: 16/762,107

(22) PCT Filed: Apr. 5, 2020

(86) PCT No.: PCT/US2020/026794
§ 371 (c)(1),
(2) Date: May 6, 2020

(87) PCT Pub. No.: WO2021/206670
PCT Pub. Date: Oct. 14, 2021

(65) Prior Publication Data
US 2023/0197483 A1    Jun. 22, 2023

(51) Int. Cl.
*H01L 21/67* (2006.01)
*H01L 21/66* (2006.01)

(52) U.S. Cl.
CPC ........ *H01L 21/67259* (2013.01); *H01L 22/12* (2013.01); *H01L 22/26* (2013.01)

(58) Field of Classification Search
CPC ... H01L 21/68259; H01L 22/12; H01L 22/26; H01L 22/20; G01B 11/272; G03F 7/70633
See application file for complete search history.

(56) References Cited

U.S. PATENT DOCUMENTS

| 5,280,437 A | 1/1994 | Corliss |
| 7,528,954 B2 | 5/2009 | Fukui |

(Continued)

FOREIGN PATENT DOCUMENTS

| CN | 109690747 A |   | 4/2019 |
| JP | 2011009411 A |   | 1/2011 |
| KR | 20060061501 A | * | 6/2006 |

OTHER PUBLICATIONS

WIPO, ISR for PCT/US2020/026794, Dec. 29, 2020.
(Continued)

*Primary Examiner* — Catherine T. Rastovski
*Assistant Examiner* — Yossef Korang-Beheshti
(74) *Attorney, Agent, or Firm* — Hodgson Russ LLP

(57) ABSTRACT

A method for correcting misregistration measurements of a semiconductor wafer for errors therein arising from tilt of the wafer including measuring, for at least one location on a wafer, a difference between a Tool Induced Shift (TIS) of a metrology device in a first illumination arrangement with respect to the wafer wherein a surface of the wafer is generally orthogonally illuminated by an illumination source of the metrology device and a TIS of the metrology device in a second illumination arrangement with respect to the wafer, wherein the surface is obliquely illuminated by the illumination source, and correcting a misregistration measurement measured by the metrology device at the at least one location for errors therein arising from tilt of the wafer at the location by subtracting from the misregistration measurement a weighted value of the difference between the TIS in the first and second illumination arrangements.

12 Claims, 4 Drawing Sheets

(56) References Cited

U.S. PATENT DOCUMENTS

| | | | |
|---|---|---|---|
| 10,345,721 B1* | 7/2019 | Cao | G03F 7/70616 |
| 2007/0064233 A1* | 3/2007 | Takagi | G03F 9/7069 |
| | | | 356/401 |
| 2007/0258624 A1 | 11/2007 | Mochida | |
| 2012/0084041 A1 | 4/2012 | Izikson et al. | |
| 2013/0286395 A1 | 10/2013 | Lee et al. | |
| 2014/0226894 A1 | 8/2014 | Wagenleitner | |
| 2018/0292326 A1* | 10/2018 | Manassen | G01N 21/8806 |
| 2019/0285407 A1 | 9/2019 | Chuang et al. | |
| 2021/0020480 A1 | 1/2021 | Levinski et al. | |

OTHER PUBLICATIONS

Katz, "Machine learning for Tool Shift (TIS) Reduction," Proceedings of SPIE, Mar. 20, 2020, vol. 11325.
EPO, Extended European Search Report issued for EP Application No. 20930091.2, Nov. 20, 2023.
Schulz et al., "Overlay Accuracy in 0.18 um Copper-Dual-Damascene Process," Equipment for Electronic Products Manufacturing, Feb. 2005, vol. 21.
CNIPA, Office Action Issued for CN Application No. 202080099200.0, Aug. 26, 2024. See X/Y/A references at pp. 7-8.

* cited by examiner

SYSTEMS AND METHODS FOR CORRECTION OF IMPACT OF WAFER TILT ON MISREGISTRATION MEASUREMENTS

FIELD OF THE INVENTION

The present invention relates generally to metrology and more particularly to misregistration measurements on semiconductor wafers.

BACKGROUND OF THE INVENTION

Various systems and methods for the measurement of misregistration in the manufacture of semiconductor wafers are known in the art.

SUMMARY OF THE INVENTION

The present invention seeks to provide novel systems and methods for the correction of misregistration measurements performed on semiconductor wafers for the impact thereon of localized wafer tilt.

There is thus provided in accordance with a preferred embodiment of the present invention a method for correcting misregistration measurements of a semiconductor wafer for errors therein arising from tilt of the wafer including measuring, for at least one location on a wafer, a difference between a Tool Induced Shift (TIS) of a metrology device in a first illumination arrangement with respect to the wafer wherein a surface of the wafer is generally orthogonally illuminated by an illumination source of the metrology device and a TIS of the metrology device in a second illumination arrangement with respect to the wafer, wherein the surface is obliquely illuminated by the illumination source, and correcting a misregistration measurement measured by the metrology device at the at least one location for errors therein arising from tilt of the wafer at the location by subtracting from the misregistration measurement a weighted value of the difference between the TIS in the first and second illumination arrangements.

Preferably, the difference between the TIS in the first and second illumination arrangements includes a signature profile varying as a function of a parameter of the metrology device.

Preferably, the metrology device illuminates the wafer by a multiplicity of wavelengths and the difference in TIS of the metrology device is measured as a function of the multiplicity of wavelengths.

Preferably, the measuring the difference in TIS is performed at a plurality of locations $N_s$ on the wafer and the difference in TIS of the metrology device is measured as a function of the multiplicity of wavelengths for each of the plurality of locations.

Preferably, the weighted value of the difference between the TIS in the first and second illumination arrangements is calculated by multiplying the difference between the TIS in the first and second illumination arrangements by a weighting coefficient.

Preferably, the weighting coefficient is calculated based on only variable parts of the misregistration measurement and the difference between the TIS in the first and second illumination arrangements.

Preferably, the weighting coefficient is calculated in accordance with $$\alpha(N_s) = \frac{\sum_\lambda \widetilde{MIS}_{measured}(N_s, \lambda) \cdot \widetilde{\Delta TIS}(\lambda)}{\sum_\lambda \widetilde{\Delta TIS}^2(\lambda)}$$

wherein $\alpha(N_s)$ is the weighting coefficient, $\widetilde{MIS}$ measure $(N_s, \lambda)$ is the variable part of the misregistration measurement and $\widetilde{\Delta TIS}(\lambda)$ is the variable part of the difference between the TIS in the first and second illumination arrangements.

Preferably, the variable part of the misregistration measurement in calculated in accordance with:

$$\widetilde{MIS}_{measured}(N_s, \lambda) = MIS_{measured}(N_s, \lambda) - \overline{MIS}_{measured}(N_s)$$

wherein $MIS_{measured}(N_s, \lambda)$ is the misregistration measurement and $\overline{MIS}_{measured}(N_s)$ is the misregistration measurement averaged over the multiplicity of illumination wavelengths.

Preferably, the subtracting from the misregistration measurement a weighted value of the difference between the TIS in the first and second illumination arrangements is performed in accordance with:

$$MIS_{corrected}(N_s) = MIS_{measured}(N_s, \lambda) - \alpha(N_s) \cdot \Delta TIS(\lambda)$$

wherein $MIS_{corrected}(N_s)$ is a corrected value of the misregistration measurement and $\Delta TIS (\lambda)$ is the difference between the TIS in the first and second illumination arrangements.

In accordance with one preferred embodiment of the method of the present invention, the method also includes optimizing an operating parameter of the metrology device based on the difference in TIS of the metrology device.

There is also provided in accordance with another preferred embodiment of the present invention a system for correcting misregistration measurements on a semiconductor wafer for errors therein arising from tilt of the wafer including an illumination source forming part of a metrology device and operative to illuminate a wafer in at least a first illumination arrangement wherein a surface of the wafer is generally orthogonally illuminated by the illumination source and a second illumination arrangement wherein the surface is obliquely illuminated by the illumination source, a TIS calculator operative to find a difference between a TIS of the metrology device in the first and second illumination arrangements and a wafer tilt corrector operative to correct a misregistration measurement by the metrology device at a location on the wafer for errors therein arising due to tilt of the wafer at the location, based on subtracting from the misregistration measurement a weighted value of the difference between the TIS of the metrology device in the first and second illumination arrangements.

Preferably, the difference between the TIS in the first and second illumination arrangements includes a signature profile varying as a function of a parameter of the metrology device.

Preferably, the illumination source is operative to illuminate the wafer by a multiplicity of wavelengths and the TIS calculator is operative to find the difference in TIS of the metrology device as a function of the multiplicity of wavelengths.

Preferably, the TIS calculator is operative to find the difference in TIS at a plurality of locations $N_s$, on the wafer, as a function of the multiplicity of wavelengths for each of the plurality of locations.

Preferably, the wafer tilt corrector is operative to calculate the weighted value of the difference between the TIS in the first and second illumination arrangements by multiplying the difference between the TIS in the first and second illumination arrangements by a weighting coefficient.

Preferably, the wafer tilt corrector is operative to calculate the weighting coefficient based on only variable parts of the misregistration measurement and the difference between the TIS in the first and second illumination arrangements.

Preferably, the wafer tilt corrector is operative to calculate the weighting coefficient in accordance with:

$$\alpha(N_s) = \frac{\sum_\lambda \widetilde{MIS}_{measured}(N_s, \lambda) \cdot \widetilde{\Delta TIS}(\lambda)}{\sum_\lambda \widetilde{\Delta TIS}^2(\lambda)}$$

wherein $\alpha(N_s)$ is the weighting coefficient, $\widetilde{MIS}_{measured}(N_s, \lambda)$ is the variable part of the misregistration measurement and $\widetilde{\Delta TIS}(\lambda)$ is the variable part of the difference between TIS in the first and second illumination arrangements.

Preferably, the wafer tilt corrector is operative to calculate the variable part of the misregistration measurement in accordance with:

$$\widetilde{MIS}_{measured}(N_s,\lambda) = MIS_{measured}(N_s,\lambda) - \overline{MIS_{measured}(N_s)}$$

wherein $MIS_{measured}(N_s, \lambda)$ is the misregistration measurement and $\overline{MIS_{measured}(N_s)}$ is the misregistration measurement averaged over the multiplicity of illumination wavelengths.

Preferably, the wafer tilt corrector is operative to subtract from the misregistration measurement a weighted value of the difference between the TIS in the first and second illumination arrangements in accordance with:

$$MIS_{corrected}(N_s) = MIS_{measured}(N_s,\lambda) - \alpha(N_s) \cdot \Delta TIS(\lambda)$$

wherein $MIS_{corrected}(N_s)$ is a corrected value of the misregistration measurement and $\Delta TIS(\lambda)$ is the difference between the TIS in the first and second illumination arrangements.

In accordance with a preferred embodiment of the system of the present invention, an operating parameter of the metrology device is optimized based on the difference in TIS of the metrology device.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
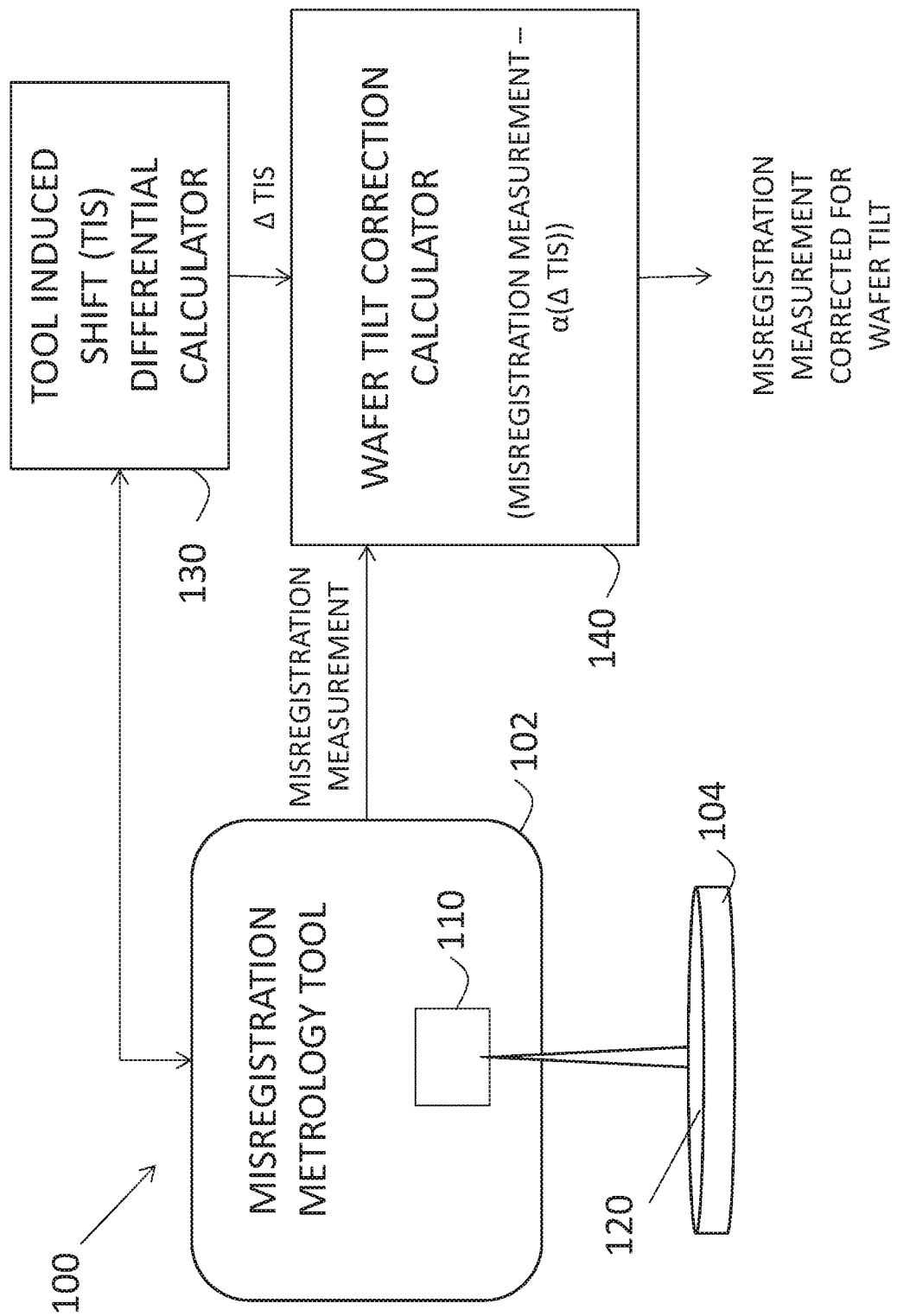
FIG. 1 is a simplified schematic partially pictorial, partially block diagram illustration of a system for the correction of misregistration measurements for the impact thereon of wafer tilt, constructed and operative in accordance with a preferred embodiment of the present invention.

Reference is now made to FIG. 1, which is a simplified schematic partially pictorial, partially block diagram illustration of a system for the correction of misregistration measurements for the impact thereon of wafer tilt, constructed and operative in accordance with a preferred embodiment of the present invention.

As seen in FIG. 1, there is a provided a metrology system 100 including a metrology tool 102 for measuring misregistration in the manufacture of a semiconductor device, such as a semiconductor wafer 104. Metrology tool 102 preferably includes an illumination source, here schematically represented as an illumination source 110, operative to illuminate wafer 104 in order to allow imaging of target structures formed on layers of wafer 104 so as to measure misregistration between layers of wafer 104. It is appreciated that, in addition to illumination source 110, metrology tool 102 typically includes various additional components as are well known in the art, omitted here for clarity, in order to facilitate imaging of wafer 104 thereby and the measurement of misregistration between layers of wafer 104.

In accordance with a particularly preferred embodiment of the present invention, metrology tool 102 may be embodied as a multi-wavelength tool, such as an Archer 700 tool, commercially available from KLA, of California, USA, operative to perform multi-wavelength measurements on wafer 104. Metrology tool 102 is preferably operative to output at least one misregistration measurement representing misregistration between layers of wafer 104 at at least one measurement location thereon. In the case that metrology tool 102 is a multi-wavelength instrument, the misregistration measurement $MIS_{measured}$ output thereby may be expressed as $MIS_{measured}(N_S, \lambda)$, wherein $N_S$ represents the particular location on wafer 104 with respect to which the measurement is performed and $\lambda$ represents the multiplicity of illumination wavelengths provided by illumination source 110.

It is understood that local variations in the tilt of a surface 120 of wafer 104 may have an impact on the accuracy of the misregistration measurement $MIS_{measured}(N_s, \lambda)$ output by metrology tool 102, due to the influence of wafer tilt on the misregistration measurement, and may therefore introduce errors therein. Preliminary measurements performed by the present inventors have shown that the local wafer tilt at target locations may vary by about ±0.5 mrad. Such local wafer tilt may have a considerable impact on misregistration measurements, which impact may become increasingly significant with increasing wafer stack height.

In accordance with preferred embodiments of the present invention, the value of the local wafer tilt at a particular location on wafer 104 may be found and the contribution thereof to errors in the misregistration measurement $MIS_{measured}(N_s, \lambda)$ may be quantified, so as to allow correction of the misregistration measurement for errors arising from local wafer tilt. This advantageously leads to the calculation of an improved misregistration measurement more accurately representing actual misregistration values for wafer 104. In accordance with preferred embodiments of the present invention, both the measurement of the wafer tilt and the quantification of the error in the misregistration measurement arising therefrom are found based on the understanding by the present inventors that the effect of wafer tilt on the misregistration measurement $MIS_{measured}(N_s, \lambda)$ is equivalent to the effect of the tilt of illumination source 110 with respect to surface 120 of wafer 104 illuminated thereby, due to the same telecentricity effect of both tilts.

The illumination source tilt contributes to the inherent limited measurement accuracy of metrology tool 102, which inherent measurement accuracy may be quantified as the Tool Induced Shift (TIS) of metrology tool 102, and does not change upon rotation of the wafer 104 by 180°. However, the wafer tilt contributes directly to the TIS calibrated misregistration measurement, and changes upon rotation of wafer 102 by 180°. Based on this understanding, measurement of changes in the TIS of metrology tool 102 under deliberately tilted illumination conditions, in comparison to non-tilted illumination conditions, may be used as a basis for finding corresponding changes in the misregistration measurement as a result of equivalent wafer tilt and hence both to quantify wafer tilt and correct the misregistration measurements for the impact of the wafer tilt thereon.

As seen in FIG. 1, the effect of tilted illumination conditions on the TIS of metrology tool 102 may be found by a TIS differential calculator 130. The preferred operation of TIS differential calculator 130 is best understood with additional reference to FIGS. 2A-2C.

Figure 2A:
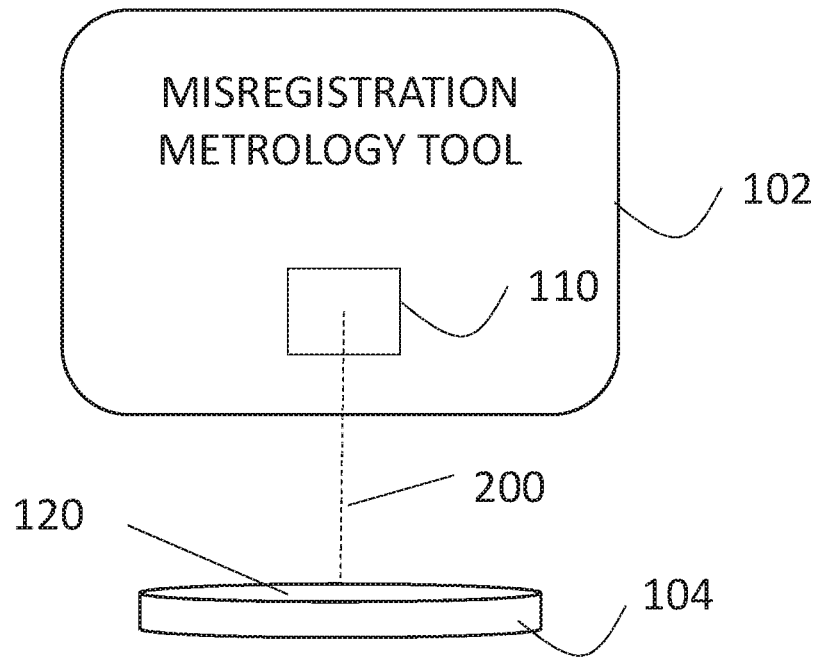
FIGS. 2A and 2B are simplified schematic illustrations of respective first and second illumination conditions of a metrology device with respect to a semiconductor wafer, useful for providing data for the correction of misregistration measurements in a system of the type shown in FIG. 1.

As seen in FIG. 2A, the TIS of metrology tool 102 is preferably initially measured in a first non-tilted illumination arrangement, wherein illumination source 110 is preferably centered with respect to an illuminated location on surface 120 of wafer 104, such that surface 120 is generally orthogonally illuminated along an illumination axis 200 by illumination source 110. The TIS of metrology tool 102 may be found by any suitable method, various types of which are well known in the art. Preferably the TIS may be quantified by measuring the same feature on surface 120 at 0° and 1800 rotation of wafer 104, the TIS being equal to half of the sum of the measurements in each wafer orientation.

Figure 2B:
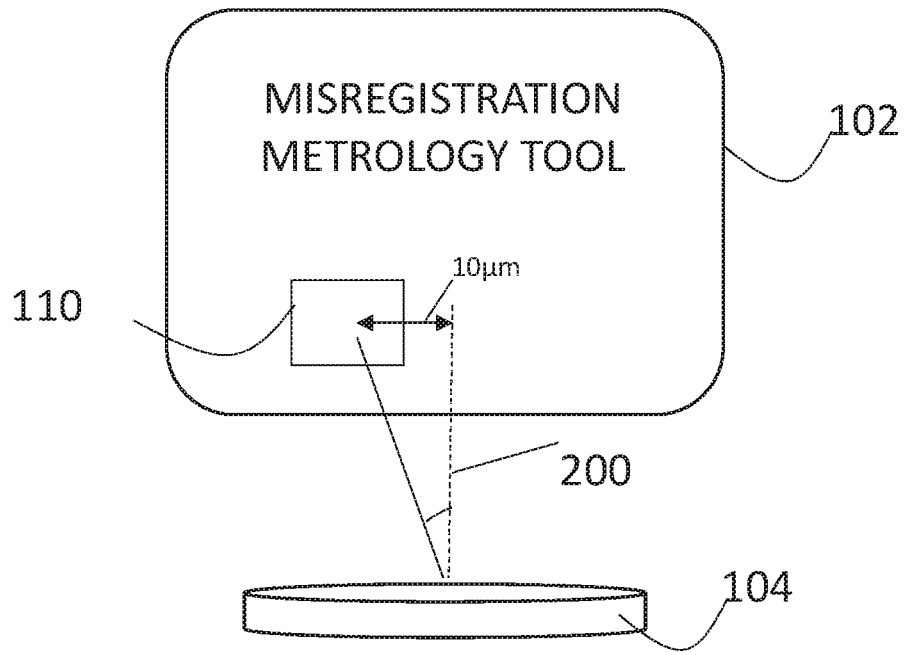

As seen in FIG. 2B, the TIS of metrology tool 102 is preferably additionally measured in a second, tilted illumination arrangement, wherein illumination source 110 is preferably shifted so as to be off-center with respect to the illuminated location on surface 120 of wafer 104, such that surface 120 is generally obliquely illuminated with respect to illumination axis 200 by illumination source 110. Here, by way of example, illumination source 110 is shown to be shifted by 10 µm, such that illumination provided thereby is incident upon surface 120 at an oblique angle of about 5 mrad.

It is understood that such measurements under first and second illumination conditions with respect to surface 120 of wafer 104 are preferably carried out prior to the performance of metrology measurements by metrology tool 102 on wafer 104, optionally as part of a preliminary training procedure performed on metrology tool 102 prior to the operation thereof. Such measurements may be performed for multiple locations on wafer 104 and, in the case of a multi-wavelength imaging metrology tool, at multiple wavelengths of illumination.

The difference in measurement accuracy, preferably expressed as the difference in TIS, of metrology tool 102 under first centered illumination conditions, such as shown in FIG. 2A, and under second off-center illumination conditions with respect to surface 120 of wafer 104, such as shown in FIG. 2B, for multiple measurement locations may be plotted as a function of illumination wavelength. An example of such a plot is shown in FIG. 2C, in which the difference in TIS (ΔTIS) of metrology tool 102 between the first and second illumination conditions of FIGS. 2A and 2B is plotted as a function of illumination wavelength for 10 measurement locations, ΔTIS for each measurement location being represented by an individual line in the graph of FIG. 2C.

Figure 2C:
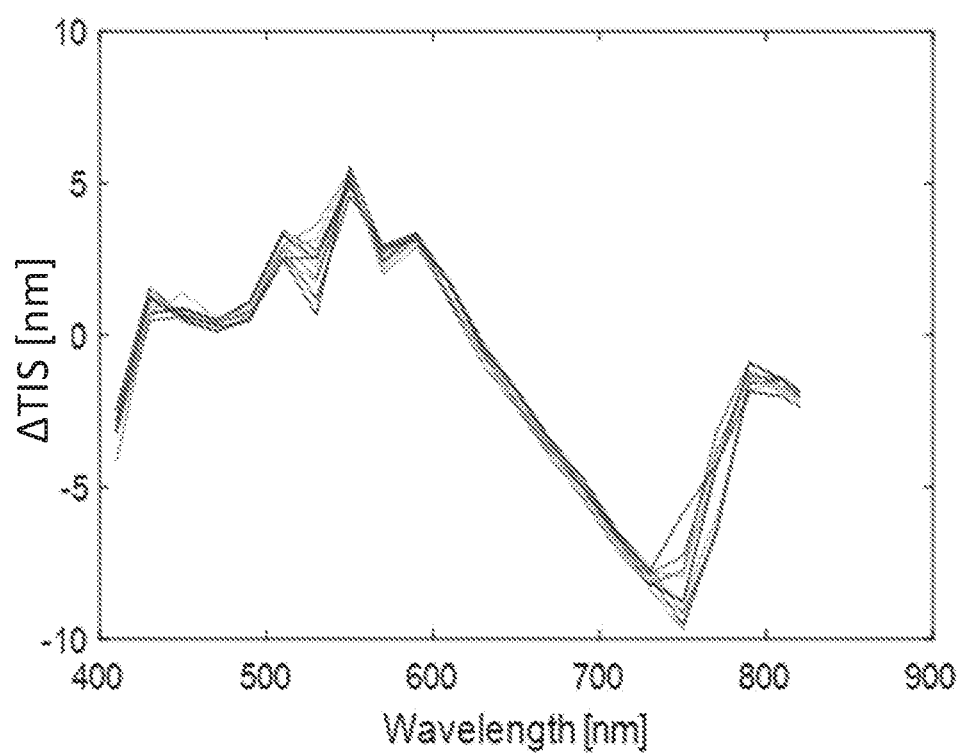
FIG. 2C is a simplified graphical representation of data obtained under the illumination conditions of FIGS. 2A and 2B.

As appreciated from consideration of FIG. 2C, ΔTIS is seen to vary significantly with illumination wavelength but not to vary significantly with illuminated location. The variation of ΔTIS as a function of wavelength, as shown in FIG. 2C, thus may be considered to correspond to a differential signature profile or landscape representing the effect of deliberate, controlled, illumination tilt and hence the equivalent effect of wafer tilt on the measurement accuracy of metrology tool 102. Based on this profile, the effect of local wafer tilt on misregistration measurements by metrology tool 102 may be corrected, as if further detailed hereinbelow.

It is understood that a profile of the type shown in FIG. 2C may be output by TIS differential calculator 130 based on measurements under conditions shown in FIGS. 2A and 2B. It is appreciated that such a profile is both specific to wafer 104 and to a given layer of wafer 104, and that such a profile thus is preferably obtained by TIS differential calculator 130 for each layer of wafer 104 upon which misregistration measurements by metrology tool 102 are to be performed. The output of such a profile by TIS differential calculator 130 is represented in FIG. 1 simply as ΔTIS. In one preferred embodiment of the present invention, TIS differential calculator 130 may be embodied as a computational module including computer code operative for finding a ΔTIS profile. It is appreciated that although TIS differential calculator 130 is shown in FIG. 1 to be embodied as a separate module, this is for the sake of clarity only, and the functionality of TIS differential calculator 130 may alternatively be included within metrology tool 102.

The ΔTIS profile obtained by TIS differential calculator 130 is preferably provided to a wafer tilt corrector, here shown to be embodied as a wafer tilt correction calculator module 140 included in system 100. Wafer tilt corrector 140 is preferably operative to correct at least one misregistration measurement measured by metrology device 102 at a given location on wafer 104 for errors therein arising due to tilt of wafer 104 at the given location. Preferably, the at least one misregistration measurement is corrected by wafer tilt corrector 140 based on subtracting from the misregistration measurement a weighted value of the difference between the TIS of metrology device 102 in first and second illumination arrangements, as quantified and output by TIS differential calculator 130.

The misregistration measurement as corrected for wafer tilt effects at a particular location $N_s$, $MIS_{measured}(N_s)$, may be expressed as:

$$MIS_{corrected}(N_s) = MIS_{measured}(N_s, \lambda) - \alpha(N_s) \cdot \Delta TIS(\lambda) \quad (1)$$

wherein $MIS_{measured}(N_s, \lambda)$ represents the at least one misregistration measurement, which is preferably provided as a misregistration landscape, being a function of the measurement location $N_S$ and the illumination measurement wavelength $\lambda$, $\Delta TIS(\lambda)$ represents the TIS differential signature profile, measured as described hereinabove with respect to FIGS. 2A-2C, and $\alpha(N_s)$ represents a location-specific weighting coefficient, representing the specific localized wafer tilt at a given location. It is appreciated that the product of the weighting coefficient $\alpha(N_s)$ and the TIS differential signature profile $\Delta TIS(\lambda)$ represents the contribution of the local value of the wafer tilt of wafer 104 to the corresponding local measured misregistration value and thus must be subtracted from the measured misregistration landscape in order to provide a 'clean' misregistration landscape corrected for errors caused by local wafer tilt. The correction of the misregistration measurement based on the TIS differential signature profile $\Delta TIS$ ($\lambda$) is based on the equivalence between changes in TIS as a result of illumination tilt and as a result of wafer tilt, as detailed hereinabove.

It is appreciated that in order to find $MIS_{corrected}(N_s)$, which parameter is the desired output of wafer tilt correction calculator module 140, the weighting coefficient $\alpha(N_s)$ must be ascertained. As a first step in ascertaining the weighting coefficient $\alpha(N_s)$, only the variable part of the measured misregistration at each location is considered, in accordance with:

$$\widetilde{MIS}_{measured}(N_s,\lambda) = MIS_{measured}(N_s,\lambda) - \overline{MIS_{measured}(N_s)} \quad (2)$$

wherein $MIS_{measured}(N_s)$ is the measured misregistration averaged overall measurement wavelengths.

The weighting coefficient $\alpha(N_s)$ may then be found by calculating the projection of the variable part of the measured misregistration at each location by the variable part of the $\Delta TIS$ in accordance with:

$$\alpha(N_s) = \frac{\sum_\lambda \widetilde{MIS}_{measured}(N_s,\lambda) \cdot \widetilde{\Delta TIS}(\lambda)}{\sum_\lambda \widetilde{\Delta TIS}^2(\lambda)} \quad (3)$$

where the variable part of the $\Delta TIS$ signature is defined for the same set of multiplicity wavelengths $\lambda$ over which the misregistration is measured, by subtracting from the $\Delta TIS$ signature the value of the $\Delta TIS$ signature averaged over the multiplicity of wavelengths. It is appreciated that calculating the weighting coefficient at each location using only the variable part of the measured misregistration landscape and the variable part of the difference in TIS, rather than the full values of these parameters, allows separation of the component of these parameters arising from wafer tilt from the actual misregistration values at each location.

The weighting coefficient $\alpha(N_s)$ found in accordance with equations (2) and (3) may then be substituted back into equation (1) so as to yield the misregistration measurement corrected for wafer tilt in accordance with $$MIS_{corrected}(N_s) = \quad (4)$$

$$MIS_{measured}(N_s,\lambda) - \frac{\sum_\lambda \widetilde{MIS}_{measured}(N_s,\lambda) \cdot \widetilde{\Delta TIS}(\lambda)}{\sum_\lambda \widetilde{\Delta TIS}^2(\lambda)} \cdot \Delta TIS(\lambda)$$

It is appreciated that the calculations described hereinabove with reference to equations (1)-(4) are preferably performed by wafer tilt correction calculator module 140 and that the corrected misregistration value, cleaned for the inaccuracies introduced therein due to wafer tilt, is preferably output thereby. In one preferred embodiment of the present invention wafer tilt correction calculator module 140 may be embodied as a computational module including computer code operative to carry out calculations in accordance with equations (1)-(4). It is appreciated that although wafer tilt correction calculator module 140 is shown in FIG. 1 to be embodied as a separate module, this is for the sake of clarity only, and the functionality of wafer tilt correction calculator module 140 may alternatively be included within metrology tool 102.

It is appreciated that the correction procedure carried out by system 100 may be implemented for correcting misregistration measurements performed on any type of symmetrical targets formed on wafer 104 and used as reference structures for measurement of misregistration in the manufacture of wafer 104. In the case that the reference targets are not symmetrical, the asymmetry of the targets must be additionally accounted for in correcting the misregistration measurements, in order to distinguish between inaccuracies in the misregistration measurements arising from local wafer tilt and components of misregistration measurements attributable to target asymmetry.

It is further appreciated that in some preferred embodiments of the present invention, measurement of $\Delta TIS$ as a function of wavelength may be used to optimize settings of metrology tool 102, for example by way of selecting a measurement wavelength having minimal sensitivity to illumination source tilt and hence to local wafer tilt. In such cases, the output of TIS differential calculator 130 may be fed back to metrology tool 102 and the settings thereof adjusted accordingly, as indicated by the double headed arrow showing optional bi-directional communication between metrology tool 102 and TIS differential calculator 130 in FIG. 1.

It is further appreciated that although the operation of TIS differential calculator 130 is described hereinabove with reference to the measurement of the dependency of the changes in TIS as a result of illumination source tilt on metrology illumination wavelength, this is by way of example only. In alternative embodiments of the present invention, changes in TIS as a result of illumination source tilt may be characterized with respect to other parameters of the metrology tool, such as, by way of example only, the focus position of the metrology tool.

Figure 3:
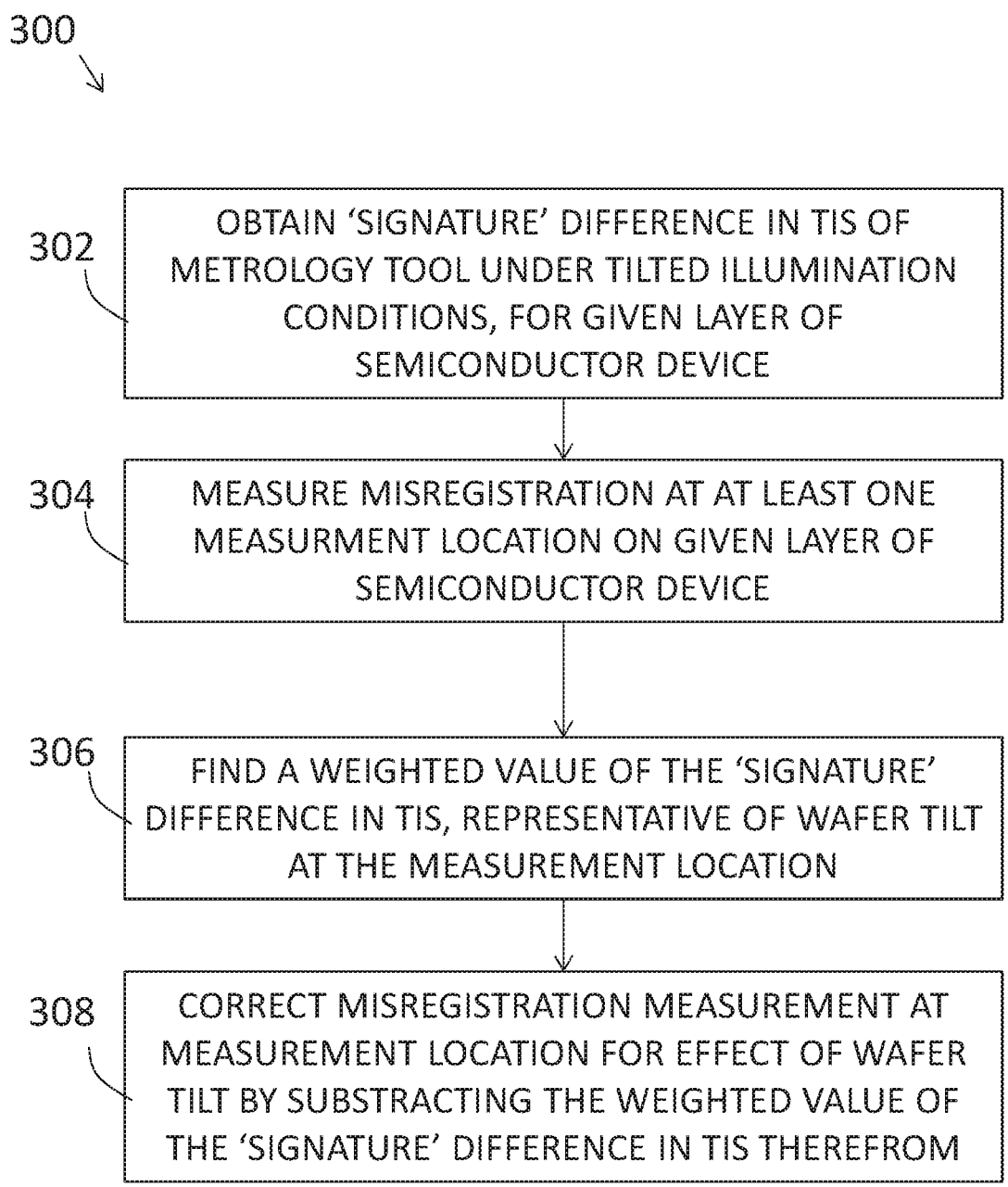
FIG. 3 is a simplified flow chart illustrating steps in the correction of misregistration measurement for the impact thereon of wafer tilt, in accordance with a preferred embodiment of the present invention.

Reference is now made to FIG. 3, which is a simplified flow chart illustrating steps in the correction of misregistration measurement for the impact thereon of wafer tilt, in accordance with a preferred embodiment of the present invention.

As seen in FIG. 3, a method 300 for the correction of misregistration measurements for the impact of wafer tilt thereon may begin at a first step 302, whereat a signature profile of the difference in TIS of a metrology tool under tilted and non-tilted illumination conditions is obtained. The signature profile may be obtained as a function of a variable characteristic of the metrology tool, for example as a function of wavelength. The signature profile may be calculated by a computerized TIS differential calculator module, such as module 130 of FIG. 1.

As seen at a second step 304, misregistration of a semiconductor device is preferably measured by the metrology tool characterized at first step 302, for at least one location on the semiconductor device. It is appreciated that although first step 302 may typically be performed prior to second step 304, this is not necessarily the case and the order of steps 302 and 304 may be reversed.

As seen at a third step 306, a weighted value of the signature profile of the difference in TIS is preferably found, which weighted value preferably corresponds to the value of the local wafer tilt at the measurement location on the semiconductor device under test. This correspondence is based on the understanding that the effect of wafer tilt on misregistration measurements is equivalent to the effect of illumination source tilt on misregistration measurements. Preferably, the weighted value is found in accordance with equations (2) and (3) detailed hereinabove.

As seen at a fourth step 308, the weighted value found at third step 306 is preferably subtracted from the misregistration measurement, so as to correct the misregistration measurement for inaccuracies therein due to local wafer tilt. It is appreciated that the corrected misregistration measurement thus obtained is more accurately representative of actual misregistration between layers of the semiconductor device under test. Preferably, the subtraction is performed in accordance with equation (4) detailed hereinabove.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A method for correcting misregistration measurements of a semiconductor wafer for errors therein arising from tilt of said wafer comprising:
measuring, for at least one location on a wafer, a difference between a Tool Induced Shift (TIS) of a metrology device in a first illumination arrangement with respect to said wafer wherein a surface of said wafer is generally orthogonally illuminated by an illumination source of said metrology device and a TIS of said metrology device in a second illumination arrangement with respect to said wafer, wherein said surface is obliquely illuminated by said illumination source; and
correcting a misregistration measurement measured by said metrology device at said at least one location for errors therein arising from tilt of said wafer at said location by subtracting from said misregistration measurement a weighted value of said difference between said TIS in said first and second illumination arrangements, wherein said difference between said TIS in said first and second illumination arrangements comprises a signature profile varying as a function of a parameter of said metrology device, wherein said metrology device illuminates said wafer by a multiplicity of wavelengths and said difference in TIS of said metrology device is measured as a function of said multiplicity of wavelengths, wherein said measuring said difference in TIS is performed at a plurality of locations $N_s$ on said wafer and said difference in TIS of said metrology device is measured as a function of said multiplicity of wavelengths for each of said plurality of locations, and wherein said weighted value of said difference between said TIS in said first and second illumination arrangements is calculated by multiplying said difference between said TIS in said first and second illumination arrangements by a weighting coefficient.

2. The method according to claim 1, wherein said weighting coefficient is calculated based on only variable parts of said misregistration measurement and said difference between said TIS in said first and second illumination arrangements.

3. The method according to claim 2, wherein said weighting coefficient is calculated in accordance with $$\alpha(N_s) = \frac{\sum_\lambda \widetilde{MIS}_{measured}(N_s, \lambda) \cdot \widetilde{\Delta TIS}(\lambda)}{\sum_\lambda \widetilde{\Delta TIS}^2(\lambda)}$$

wherein $\alpha(N_s)$ is said weighting coefficient, $\widetilde{MIS}_{measured}(N_s, \lambda)$ is said variable part of said misregistration measurement and $\widetilde{\Delta TIS}(\lambda)$ is said variable part of said difference between said TIS in said first and second illumination arrangements.

4. The method according to claim 3, wherein said variable part of said misregistration measurement in calculated in accordance with:

$$\widetilde{MIS}_{measured}(N_s, \lambda) = MIS_{measured}(N_s, \lambda) - \overline{MIS_{measured}(N_s)}$$

wherein $MIS_{measured}(N_s, \lambda)$ is said misregistration measurement and $\overline{MIS_{measured}(N_s)}$ is said misregistration measurement averaged over said multiplicity of illumination wavelengths.

5. The method according to claim 4, wherein said subtracting from said misregistration measurement said weighted value of said difference between said TIS in said first and second illumination arrangements is performed in accordance with:

$$MIS_{corrected}(N_s) = MIS_{measured}(N_s, \lambda) - \alpha(N_s) \cdot \Delta TIS(\lambda)$$

wherein $MIS_{corrected}(N_s)$ is a corrected value of said misregistration measurement and $\Delta TIS(\lambda)$ is said difference between said TIS in said first and second illumination arrangements.

6. A system for correcting misregistration measurements on a semiconductor wafer for errors therein arising from tilt of said wafer comprising:
an illumination source forming part of a metrology device and operative to illuminate a wafer in at least a first illumination arrangement wherein a surface of said wafer is generally orthogonally illuminated by said illumination source and a second illumination arrangement wherein said surface is obliquely illuminated by said illumination source;
a Tool Induced Shift (TIS) calculator operative to find a difference between a TIS of said metrology device in said first and second illumination arrangements; and
a wafer tilt corrector operative to correct a misregistration measurement by said metrology device at a location on said wafer for errors therein arising due to tilt of said wafer at said location, based on subtracting from said misregistration measurement a weighted value of said difference between said TIS of said metrology device in said first and second illumination arrangements, wherein said difference between said TIS in said first and second illumination arrangements comprises a signature profile varying as a function of a parameter of said metrology device, wherein said illumination source is operative to illuminate said wafer by a multiplicity of wavelengths and said TIS calculator is operative to find said difference in TIS of said metrology device as a function of said multiplicity of wavelengths, wherein said TIS calculator is operative to find said difference in TIS at a plurality of locations $N_s$ on said wafer, as a function of said multiplicity of wavelengths for each of said plurality of locations, wherein said wafer tilt corrector is operative to calculate said weighted value of said difference between said TIS in said first and second illumination arrangements by multiplying said difference between said TIS in said first and second illumination arrangements by a weighting coefficient.

7. The system according to claim 6, wherein said wafer tilt corrector is operative to calculate said weighting coefficient based on only variable parts of said misregistration measurement and said difference between said TIS in said first and second illumination arrangements.

8. The system according to claim 7, wherein said wafer tilt corrector is operative to calculate said weighting coefficient in accordance with:

$$\alpha(N_s) = \frac{\sum_\lambda \widetilde{MIS}_{measured}(N_s, \lambda) \cdot \widetilde{\Delta TIS}(\lambda)}{\sum_\lambda \widetilde{\Delta TIS}^2(\lambda)}$$

wherein $\alpha(N_s)$ is said weighting coefficient, $\widetilde{MIS}_{measure}(N_s, \lambda)$ is said variable part of said misregistration measurement and $\widetilde{\Delta TIS}(\lambda)$ is said variable part of said difference between TIS in said first and second illumination arrangements.

9. The system according to claim 8, wherein said wafer tilt corrector is operative to calculate said variable part of said misregistration measurement in accordance with:

$$\widetilde{MIS}_{measured}(N_s,\lambda) = MIS_{measured}(N_s,\lambda) - \overline{MIS}_{measured}(N_s)$$

wherein $MIS_{measured}(N_s, \lambda)$ is said misregistration measurement and $\overline{MIS}_{measured}(N_s)$ is said misregistration measurement averaged over said multiplicity of illumination wavelengths.

10. The system according to claim 9, wherein said wafer tilt corrector is operative to subtract from said misregistration measurement a weighted value of said difference between said TIS in said first and second illumination arrangements in accordance with:

$$MIS_{corrected}(N_s) = MIS_{measured}(N_s,\lambda) - \alpha(N_s) \cdot \Delta TIS(\lambda)$$

wherein $MIS_{corrected}(N_s)$ is a corrected value of said misregistration measurement and $\Delta TIS(\lambda)$ is said difference between said TIS in said first and second illumination arrangements.

11. The method according to claim 1, further comprising optimizing an operating parameter of said metrology device based on said difference in TIS of said metrology device.

12. The system according to claim 6, wherein an operating parameter of said metrology device is optimized based on said difference in TIS of said metrology device.

* * * * *